United States Patent [19]

Carter et al.

[11] 4,219,783
[45] Aug. 26, 1980

[54] PHASE LOCKED LOOP WITH RAPID PHASE PULL IN

[75] Inventors: Margaret P. Carter, Harrow; David Hodgson, Aston Rowant, both of England

[73] Assignee: British Communications Corporation, Ltd., England

[21] Appl. No.: 922,734

[22] Filed: Jul. 7, 1978

[30] Foreign Application Priority Data

Apr. 28, 1978 [GB] United Kingdom ............ 17023/78

[51] Int. Cl.² .................................................. H03B 3/04
[52] U.S. Cl. ...................................... 331/1 A; 328/134; 331/17; 331/27
[58] Field of Search ................ 331/1 A, 10, 14, 17, 331/18, 25, 27; 325/419, 420, 421, 423; 328/133, 134, 155

[56] References Cited

U.S. PATENT DOCUMENTS

| | | | |
|---|---|---|---|
| 3,407,361 | 10/1968 | Galopin | 331/10 |
| 3,716,802 | 2/1973 | Muratani et al. | 331/17 X |
| 3,824,483 | 7/1974 | Margala et al. | 331/17 X |

Primary Examiner—Siegfried H. Grimm
Assistant Examiner—Edward P. Westin
Attorney, Agent, or Firm—Leydig, Voit, Osann, Mayer & Holt, Ltd.

[57] ABSTRACT

A frequency tuning arrangement for tuning a source of variable frequency to a desired frequency, comprises a phase lock loop having a reference frequency source, an adjustable divider dividing the variable frequency to produce an adjustable control frequency, a phase comparator for comparing the phases of the control and reference frequencies to produce a control signal dependent on any phase error detected, and adjusting means responsive to the control signal for adjusting the variable frequency so as to equalize the phases of the control and reference frequencies. In accordance with the invention, means responsive to the phase error imposes on the leading one of the control and reference frequencies a phase delay which is substantially equal to the phase error. This enables the system to respond very rapidly to changes in desired frequency.

5 Claims, 3 Drawing Figures

PHASE LOCKED LOOP WITH RAPID PHASE PULL IN

BACKGROUND OF THE INVENTION

The invention relates to electrical circuit arrangements. More specifically, the invention relates to frequency tuning circuit arrangements or systems for producing a desired frequency such as for use in a radio transmitter or receiver.

BRIEF SUMMARY OF THE INVENTION

According to the invention, there is provided a frequency tuning arrangement for tuning a source of variable frequency to a desired frequency, comprising a source of reference frequency, frequency adjusting means connected to receive the variable frequency and to alter it by an adjustable factor so as to produce a control frequency, phase comparison means connected to compare the phases of the control frequency and the reference frequency whereby to produce a control signal dependent on the magnitude and direction of any phase error detected, adjusting means responsive to the control signal and connected to adjust the variable frequency source so as to change the variable frequency in a sense and by an amount so as to tend to equalize the phases of the control and reference frequencies, and control means responsive to the said phase error for imposing a phase change on at least one of the control and reference frequencies which has the effect of delaying the instantaneously leading one of the control and reference frequencies relative to the other by a phase delay which is substantially equal to the said phase error.

According to the invention, there is also provided an automatic frequency tuning system, comprising a fixed frequency oscillator, a first frequency divider having a fixed division factor and connected to be fed by the fixed frequency oscillator so as to produce a reference frequency, a variable frequency oscillator, a second divider having a variable division factor and connected to be fed by the variable frequency oscillator so as to produce a variable control frequency, phase comparison means connected to receive and compare the phases of the reference and control frequencies whereby to produce a control output having a magnitude and sense dependent on the magnitude and sense of a phase error between the two frequencies compared, integrating means connected to integrate the control output, adjusting means responsive to the integrated control output and connected to adjust the frequency of the variable frequency oscillator in a sense and by an amount such as to tend to equalize the phases and frequencies of the control and reference frequencies, whereby to bring the output frequency of the variable frequency oscillator to a desired value, and re-timing means responsive to detection of the said phase error by the phase comparison means and connected to re-time the one of the two dividers producing the instantaneously earlier one of the two frequencies whose phases are compared by the phase comparison means, so that the re-timed one of the two dividers commences its next following division cycle substantially in synchronism with the other of the dividers.

DESCRIPTION OF THE DRAWINGS

An electrical frequency tuning system embodying the invention will now be described by way of example with reference to the accompanying drawings in which.

DESCRIPTION OF PREFERRED EMBODIMENTS

Figure 1:
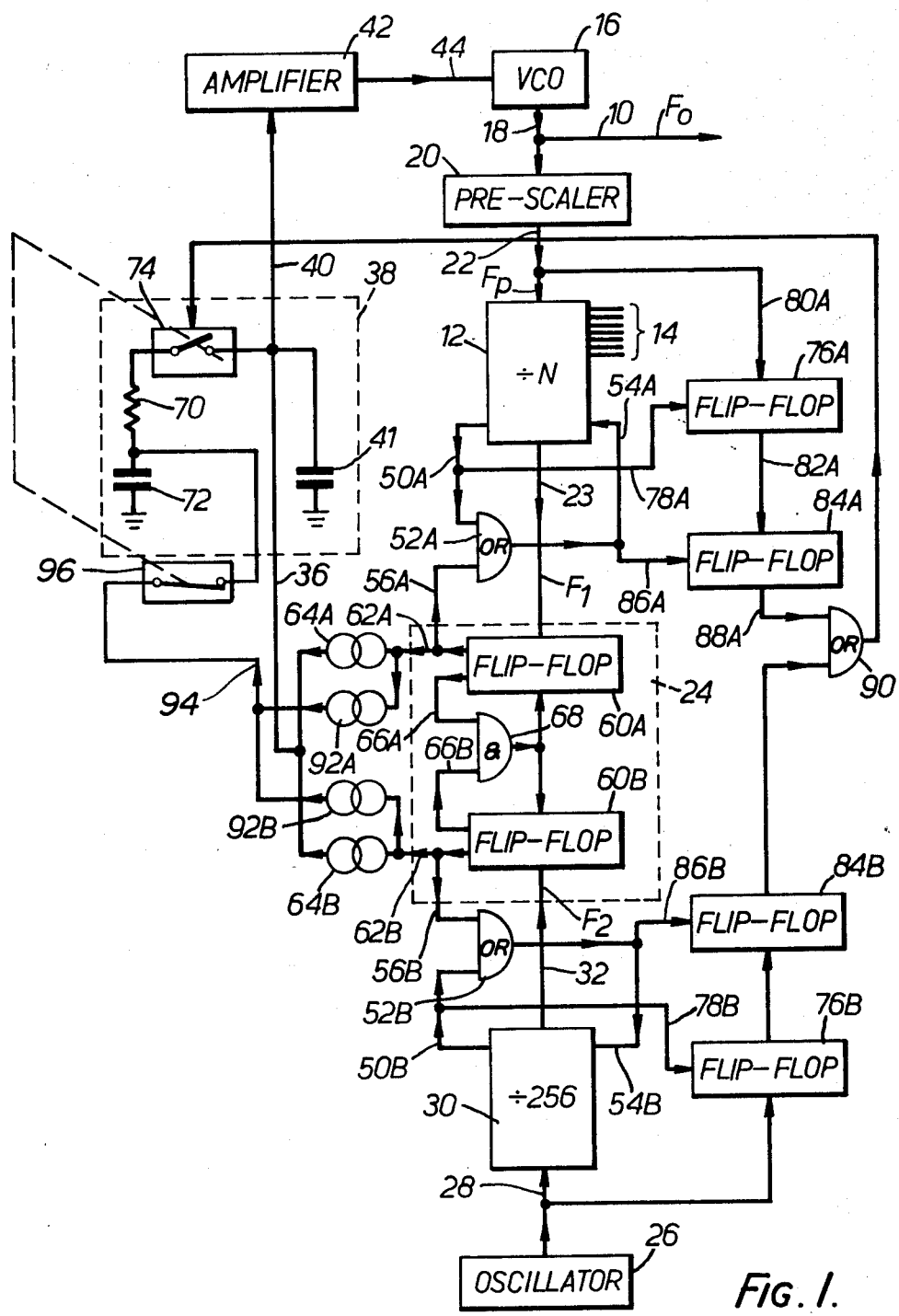
FIG. 1 is a circuit diagram, partly in block form and partly schematic, of the system.

The circuit of FIG. 1 is for tuning a radio receiver or transmitter (though is not restricted to such use). It produces an output frequency Fo on a line 10 which is variable under control of digital control information fed into a variable divider 12 on input lines 14. The digital information varies the division factor N and may come, for example, from a manually operable control which is used by an operator to tune the receiver or transmitter. Instead, however, it may come from some other source. The circuit arrangement is capable of changing the value of Fo very rapidly (in dependence on changes in the digital information received on lines 14), and in such a case the information on lines 14 may originate from a source operating to a predetermined program.

The circuit includes a voltage controlled oscillator (VCO) 16 which produces frequency Fo on the line 10 and also feeds this frequency, by means of a line 18, to a pre-scaler divider 20. If the output frequency Fo is in the range of, say, 30 MHz to about 100 MHz, then the division factor of the pre-scaler divider 20 is arranged to be such that its output frequency, Fp, on a line 22, lies in the range 3 to 9 MHz. The frequency Fp is fed on line 22 to the input of the divider 12. Pulses at the output frequency, $F_1$, of the divider 12 are fed by means of a line 23 to an input of a phase detector shown by the dotted line 24.

As shown, the circuit arrangement also comprises a temperature controlled crystal oscillator 26 which oscillates at a fixed frequency Ff which by way of example only, is taken to be 6.4 MHz. The output frequency Ff is fed on a line 28 to a fixed divider 30. If the fixed divider 30 is assumed, by way of example, to have a division factor of, say, 256, then the output pulses produced by the divider on a line 32 have a frequency $F_2$ of 25 kHz and are fed into the phase detector 24.

In a manner to be explained in more detail below, if the output frequencies $F_1$ and $F_2$ from the dividers 12 and 30, respectively, are equal in phase and frequency, the phase detector 24 produces no output. However, if there is a phase difference, as will occur when the frequencies $F_1$ and $F_2$ differ, then the phase detector 24 will produce a succession of output pulses, on its output line 36, each representative of this difference. These output pulses will be applied, via a loop filter 38 and a line 40, to an amplifier 42. The loop filter 38 includes a capacitor 41 which integrates the pulses on line 36 and the amplified signal from amplifier 42 is applied by means of a line 44 to the control input of the oscillator 16 and adjusts its frequency accordingly. The system is arranged so that the direction of adjustment of output frequency of the oscillator 16 is such that the frequency $F_1$ produced by the divider 12 is brought towards phase equality with the frequency $F_2$, and when this situation is reached, the output on line 36 disappears. Therefore, the system operates by bringing $F_1$ into phase and frequency equality with $F_2$. Amplifier 42 may have a non-linear gain characteristic to compensate for the non-linear control signal/output frequency characteristic of the VCO 16.

When it is desired to set Fo to a desired frequency, therefore, appropriate digital information is fed onto the control lines 14 so as to set the divider 12 to such value that, when its output frequency, $F_1$, is 25 KHz (which is the value to which, in the example being considered, it will be driven by the operation of the phase detector 24), the output frequency Fo of the VCO will have the required value.

The divider 12 may take the form of a digital counter, for example a "down" counter. Under steady state conditions, a predetermined digital number (depending on the digital control information fed in on the control lines 14) is loaded into the counter at the beginning of each of its counting cycles, and the pulses at the frequency Fp (on line 22) then cause the counter to count down from this predetermined number. When the count of counter reaches zero, an output pulse is produced on the line 23, and at the same time the predetermined number (depending on the digital information on the lines 14 at this instant) is reloaded into the counter and the next counting cycle commences. The frequency, $F_1$, of the pulses on line 23 is therefore equal to the frequency Fp divided by N where N is the number which is loaded into the counter at the beginning of each counting cycle.

The divider 30 is of similar form except that it is wired up so that the number reloaded into it at the beginning of each counting cycle is fixed (at 256 in the example being considered).

As stated above, the divider operation just described is that which takes place under steady state conditions. The operation is modified when the phase detector 24 detects a difference in phase between $F_1$ and $F_2$, as will be described.

As shown in FIG. 1, divider 12 has a "0" line 50A on which is produced a control signal when the divider has counted its pre-loaded count down to zero, and this signal is fed through an OR gate 52A to a line 54A which is connected to a "PARALLEL ENABLE" input of the divider. When the "PARALLEL ENABLE" input is energized, the predetermined number represented by the digital information on the control lines 14 at this instant is loaded into the divider.

Line 54A can also be energized, via a second input to the OR gate 52A, by means of a line 56A from the phase detector 24.

Divider 30 is similarly wired, its connections being identified by the suffix "B" instead of "A". In practice, the connection 50B from the "0" output to the "PARALLEL ENABLE" input 54B via the OR gate 52B may be wired internally as part of the divider.

As indicated above, energization of the "PARALLEL ENABLE" input of each divider causes the predetermined number to be loaded into the divider so as to enable counting to restart. Counting cannot actually restart until the "PARALLEL ENABLE" line has become de-energized again. Energization of the "PARALLEL ENABLE" input of each divider by means of its "0" output is only momentary, and counting therefore recommences substantially without interruption. However, when the "PARALLEL ENABLE" input is energized from the phase detector by the line 56A or 56B as appropriate, this energization may last longer (as will be explained) and for so long as it lasts, restarting of the counting process is delayed.

As shown in FIG. 1, the phase detector 24 includes two flip-flop circuits 60A and 60B. The SET input of flip-flop 60A is connected to receive the pulses $F_1$ on the line 23. Similarly, the SET input of flip-flop 60B is connected to receive the pulses $F_2$ on the line 32 from the divider 30. When SET, flip-flop circuit 60A produces an output on a line 62A which energizes a current generator 64A to feed current of a predetermined quantity and polarity onto line 36 connected to the loop filter 38. Similarly, when flip-flop 60B is SET, it energizes a current generator 64B via a line 62B, and this current generator produces current of equal quantity and opposite polarity which is fed by means of line 36 to the loop filter 38.

Flip-flop 60A also has a second output, on a line 66A, which changes state with the change of state of line 62A, and is connected through an AND gate 68 to RESET inputs of both flip-flops. Flip-flop 60B has a corresponding output line 66B.

As shown, line 56A is connected to line 62A, while line 56B is connected to line 62B.

The operation of the arrangement as so far described will now be explained in conjunction with FIG. 2.

It will initially be assumed that the frequencies $F_1$ and $F_2$ are equal in phase, and FIGS. 2A and 2B respectively illustrate three consecutive pulses $F_1$ and the corresponding, inphase, pulses $F_2$.

In response to the first pulse at the frequency $F_1$, flip-flop 60A is set and produces an output on line 62A as shown in FIG. 2C. Simultaneously, flip-flop 60B is SET by the first pulse of the frequency $F_2$ and produces an output on line 62B as shown by waveform 2D. However, each flip-flop is immediately RESET by the RESET outputs produced on lines 66A and 66B, as shown in waveforms 2E and 2F.

Only momentary pulses are therefore produced on lines 62A and 62B, and the current generators 64A and 64B are not effectively energized.

In response to the first pulse of the frequency F1, a pulse will be produced from the "0" output of divider 12 on line 50A as shown in waveform 2G. As shown in FIG. 1, this pulse is fed via gate 52A to the "PARALLEL ENABLE" input of divider 12 and reloads the divider with the digital number existing at that time on the control lines 14. The PARALLEL ENABLE input of divider 12 also receives a pulse on line 56A (FIG. 1) from the output line 62A of flip-flop 60A, but as shown in waveform 2H, this pulse is a momentary pulse as well. Divider 12 therefore immediately starts recounting.

A similar operation occurs in respect of divider 30 as shown in waveforms 2I (the signal on line 50B) and 2J (the signal on line 56B). Divider 30 therefore immediately starts recounting.

Figure 2:
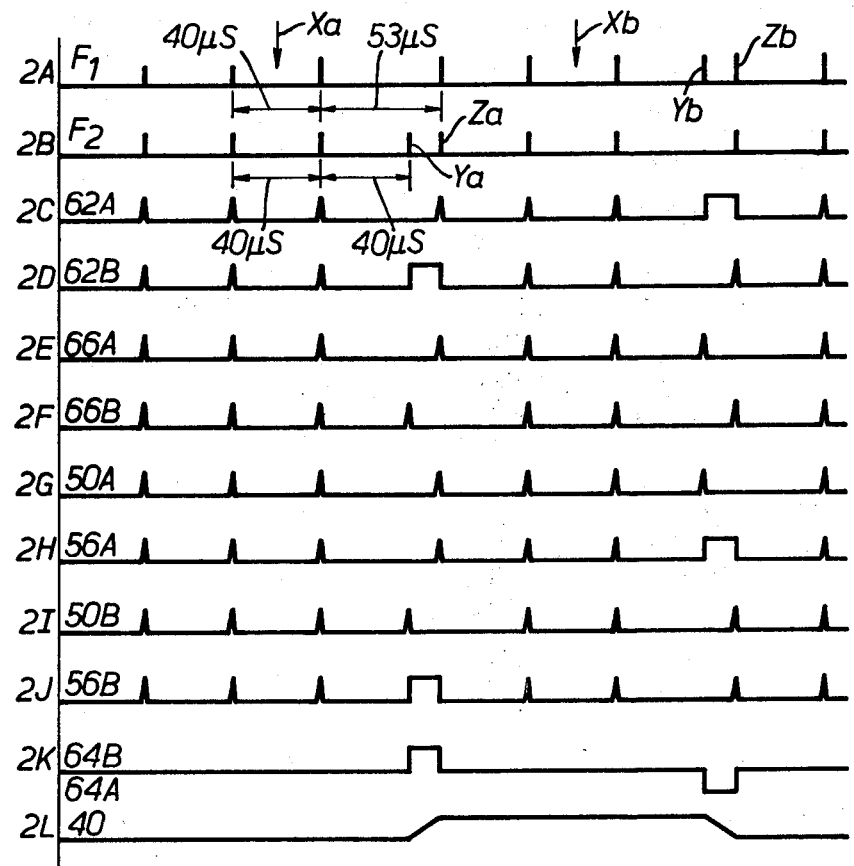
FIG. 2 shows waveforms occurring in the system.

The above described operation continues for so long as $F_1$ and $F_2$ are in phase and this situation is illustrated in FIG. 2 for the next two following pulses of these frequencies.

It will now be assumed that a change in the desired value for the frequency Fo is made—by altering the digital information fed to the control lines 14 of divider 12 (FIG. 1). It will be assumed that this change in desired frequency occurs at time Xa (FIG. 2). The means that the new information (that is, the changed number represented by the digital signals on lines 14) will be loaded into the divider 12 in response to the occurrence of the third pulse of the frequency $F_1$ coincidentally with the energization of its "PARALLEL ENABLE" input 54A by the coincident signals on lines 50A and 56A.

Up to this time, the frequencies $F_1$ and $F_2$ have each been 25 kHz, and therefore the pulse period has been 40 $\mu S$ seconds. It will be assumed initially that the new desired value for Fo is greater than the previous value. The new digital information on lines 14 will therefore have increased the division factor of the divider 12. Until the VCO 16 has altered its frequency, the effect will be to reduce $F_1$ and therefore increase its period. It will be assumed, by way of example, that the new digital information has the effect of increasing the period of frequency $F_1$ from 40 to 53 $\mu S$—as shown by the spacing between the third and fourth pulses of waveform 2A. Until the fourth pulse of frequency $F_1$ occurs, flip-flop 60A will not be SET, and nor will the "PARALLEL ENABLE" input of divider 12 be energized.

However, frequency $F_2$ continues to be 25 kHz, and the fourth pulse of frequency $F_2$ will therefore occur 40 $\mu S$ after the third pulse—as indicated at Ya in FIG. 2. At this instant, therefore, flip-flop 60B is SET as shown in waveform 2D. It remains so SET, at least for the time being, because it receives no RESET pulse from flip-flop 60A (which has not yet been SET). Therefore, it energizes the current generator 64B which starts to produce a current output as shown in waveform 2K.

At the time instant Ya the "0" output of divider 30 will be energized and will produce an output on line 50B (FIG. 1) for energizing the "PARALLEL ENABLE" input 54B of divider 30—as shown in waveform 2I. However, line 56B will also be energized, by the SET output of flip-flop 60B, and will be held in the energized state, as shown in FIG. 2J, while flip-flop 60B is held SET. This means that although the preset number (256) is reloaded into divider 30, the divider cannot restart counting.

13 $\mu S$ after time instant Ya, that is, at a time instant Za (FIG. 2), the next pulse of frequency $F_1$ occurs. This switches flip-flop 60A into the SET state as shown in waveform 2C, and this has the effect of immediately switching flip-flop 60B into the RESET state as shown in FIG. 2D. Therefore, the current generator 64B is switched off (waveform 2K) and the "PARALLEL ENABLE" input 54B of divider 30 is de-energized (waveform FIG. 2J). Divider 30 can now re-start counting.

As soon as flip-flop 60B becomes RESET in this way, it switches flip-flop 60A into the RESET state (FIG. 2C). The "PARALLEL ENABLE" input 54A of divider 12 is therefore not held energized, and divider 12 becomes therefore immediately reloaded with the count represented by the number on the digital input lines 14 and immediately commences counting again.

FIG. 2L shows the waveform of the output produced on line 40 (FIG. 1) by the loop filter 38 during the time between instant Ya and instant Za. During this time, the loop filter integrates the current received from current generator 64B (FIG. 2K). The resultant change in level of the output of the amplifier 42 adjusts the frequency of the oscillator 16 so as to increase the output frequency Fo. If, as is assumed in FIG. 2, the loop gain of the system is correct, the oscillator frequency Fo will be adjusted to the correct value so that, after division by the divider 12, the resultant frequency ($F_1$) is back at 25 kHz. Therefore, the next period of the frequency $F_1$ will be 40 $\mu S$ as shown in FIG. 2.

If the required change in frequency Fo is in the opposite direction, then the operation of the system is similar to that described, except that it is flip-flop 60A which is held SET, so as to energize current generator 64A instead of generator 64B. The operation is illustrated in FIG. 2, where it is assumed that the change (reduction) in frequency Fo is input at time instant Xb (that is, this is the time instant at which the operator feeds in the changed digital information on the lines 14). Time instants Yb and Zb correspond to time instants Ya and Za. As shown, the output of the loop filter 38 is now in the opposite direction, and results in a reduction in the frequency of the VCO 16. Again, it is assumed that the loop gain of the system is such that the VCO 16 becomes adjusted to the correct frequency.

In each case, therefore, a change in frequency is not only implemented by the loop filter 38 acting on the VCO 16, but at the same time the operation of one or other of the two dividers 12 and 30 is held up and then allowed to start again in synchronism with the other divider. This contrasts with previous systems in which the facility of holding up and re-starting one or other of the dividers is not provided. In such previous systems, the dividers are always immediately re-started at the end of their counting cycles. In such a previous system, it can be shown that it is not possible to bring the system back into lock at a new desired frequency using a loop filter in the form of a simple integrator; if attempts are made in such a system to use a simple integrator, then although the effect of the first detected phase difference will be to bring the frequency from the variable divider back to equality with the frequency from the fixed divider, there will still be a phase difference—because of the inequality of the lengths of the periods of the two frequencies which occurred in response to the initial change in frequency. Therefore, the phase detector will cause a further change in frequency of the output from the variable divider and this will tend to bring the two frequencies into instantaneous phase equality but to unequalize their frequencies. Therefore, after the next period, their phases will be once more unequal and the phase detector will cause a further change in frequency from the variable divider, this time in the opposite direction. It can be shown that the effect of this is to cause the frequency from the variable divider to oscillate about the desired value at one sixth of the frequency from the fixed divider. In such previous systems, therefore, it has been customary to modify the loop filter so as to include a damping circuit tuned to damp out this oscillation. Because the system disclosed herein brings the oscillator to the new frequency without using such a damping circuit, it can do so very much more rapidly than such previous systems.

However, although the system disclosed herein enables a loop filter in the form of a simple integrator to be used for bringing the system towards the new desired frequency, it can only operate in the manner described if the phase difference between the pulses $F_1$ and $F_2$ is greater than the clock period of each divider, that is, the period between successive input pulses to each divider; this clock period is of the order of 156 nS for the divider 30, and of the same order for the other divider. This results from the fact that the minimum length of time for which counting of one or other of the two dividers can be delayed (in the manner explained, by holding energization of the "PARALLEL ENABLE" line) is 156 nS. If the phase error is less than 156 nS, therefore (in this example), delaying of the counting of one or other of the two dividers cannot take place, and the system will therefore operate like the previous systems referred to above; that is, one or other of the two flip-flops 60A, 60B will be held SET for a sufficient period (but less than 156 nS in this example) so as to cause the loop filter to produce an output which will adjust the VCO 16 in the appropriate direction so as to tend to correct the phase error. As there is no retiming of either of the dividers 12 and 30 in this case, however, the oscillation, at one sixth of the nominal output frequency of the dividers, will tend to take place, and to avoid this, a damping circuit must be provided in the loop filter.

Therefore, the system is arranged so that the loop filter 38 includes a damping circuit but with means for switching this damping circuit out of operation automatically when the phase error exceeds the clock period of the dividers (nominally 156 nS in this example).

As shown in FIG. 1, therefore, the loop filter 38 includes (in addition to the integrating capacitor 41) a damping circuit comprising a resistor 70 and a capacitor 72 which are arranged to provide damping at the specified frequency and can be switched into and out of operation by means of a switch 74 (which would of course in practice be an electronic switch). The switch 74 is controlled by means for detecting whether the phase error is greater than the length of one clock period of either of the dividers.

In order to determine whether the phase error is greater or less than clock period, the detecting circuits now to be described respond to the output signal produced by each divider when it reaches its "0" count, by interrogating the state of the "PARALLEL ENABLE" line to that divider when the immediately following input pulse to that divider occurs. If the "PARALLEL ENABLE" line is energized at this time, this indicates that the phase error is greater than the length of one clock period, and switch 74 is held open; otherwise, switch 74 is held closed.

As shown in FIG. 1, therefore, a flip-flop circuit 76A is provided and is connected to be set into one of its states by a signal received on a line 78A from the "0" output of the divider 12. The flip-flop 76A has a second input received on a line 80A from the input to that divider, and the next pulse on line 80A after the "0" output of the divider switches the flip-flop 76A so as to produce an output on a line 82A. This is fed into a second flip-flop circuit 84A which also receives an input, on a line 86A, in parallel with the input to the "PARALLEL ENABLE" input of divider 12. Therefore, circuit 84A produces an output on a line 88A if line 86A is energized when the pulse on line 82A occurs. This signal on line 88A will therefore arise only if the phase error is greater than the length of one clock period, and if it arises, it will be maintained until the divider 12 next reaches zero count (whereupon the resultant "0" output will reset the circuits 76A and 84A).

Divider 30 is provided with similar circuitry (which is referenced similarly except for the use of suffix 'B' instead of suffix 'A'), and these detect whether divider 30 is responding (that is, being re-timed) as a result of a phase difference greater than one clock period.

Lines 88A and 88B are fed via an OR gate 90 to control the switch 74.

However, it is not possible merely to switch in the damping circuit 70, 72, by closing switch 74. This is because the capacitor 72 has a considerably larger capacitance than capacitor 41 (approximately six times greater) and unless it has previously been charged to approximately the same voltage as capacitor 41 when it is switched into circuit, it will not provide correct damping.

In order to deal with this problem, therefore, each current generator 64A, 64B has associated with it a respective additional current generator 92A, 92B and these are connected by a line 94 and a switch 96 to capacitor 72 in the loop filter 38. Switch 96 is ganged with switch 74 so as to be open when that switch is closed, and vice versa. The additional current generators 92A and 92B are arranged so that their current outputs are greater than the current outputs of the current generators 64A and 64B by a multiplying factor which is the same as the multiplying factor between the capacitance of capacitor 72 and the capacitance of capacitor 41. In this way, when capacitor 41 becomes charged up to a particular voltage, in response to operation of either current generator 64A or 64B, capacitor 72 becomes charged up to substantially the same voltage. When the damping circuit is switched into operation (in the manner explained) by closure of switch 74, capacitor 72 will therefore be at the correct voltage and (by virtue of the simultaneous opening of the switch 96) can provide correct damping action.

Figure 3:
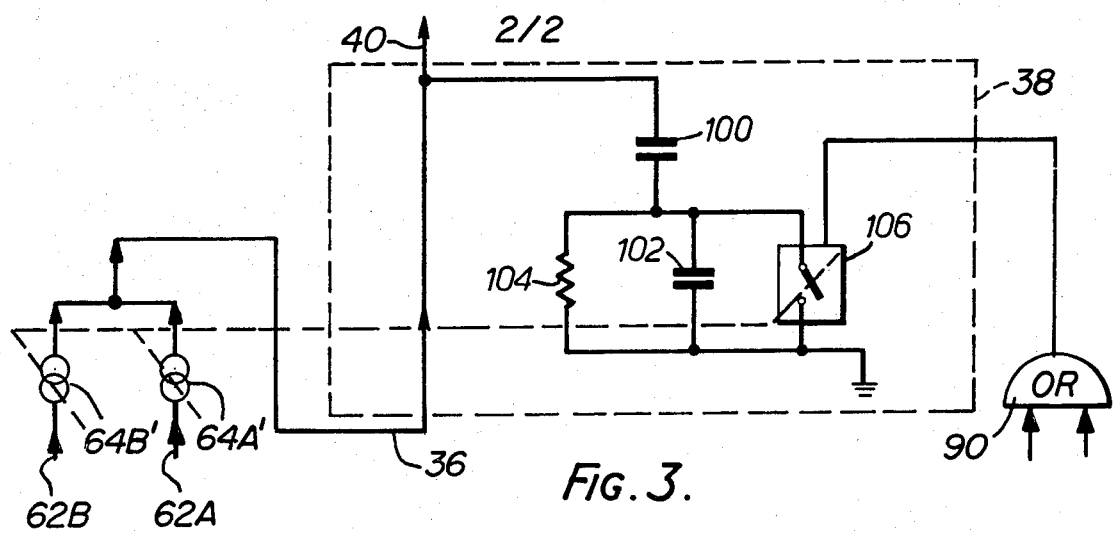
FIG. 3 is a schematic circuit diagram of a modified form which part of the system can take.

FIG. 3 shows a modified form which the loop filter 38 can take. In this case, the filter has two capacitors 100 and 102 with the latter having a resistor 104 and a switch 106 connected in parallel with it. Switch 106 is connected to be controlled by the circuits described above for determining whether the phase error between the frequencies $F_1$ and $F_2$ exceeds the length of a clock period of the dividers. When the phase error exceeds this period, switch 106 is closed, so that the filter acts as a simple integrator. When the phase error is less than this period, switch 106 is opened and damping is provided by capacitor 102 and resistor 104. Again capacitor 100 has a greater capacitance than capacitor 102. To ensure that the correct voltages are provided across the capacitors, current generators 64A' and 64B' (respectively corresponding to the current generators 64A and 64B in FIG. 1) are each arranged to be switchable between a state in which they each produce a relatively low output (corresponding to the condition when switch 106 is closed) and a state in which each produces a relatively high output (corresponding to the condition when switch 106 is open). It is not necessary, therefore, with this type of loop filter, to provide the secondary current generators 92A and 92B.

Other forms of circuits, either for the loop filter or for other parts of the system, are of course possible.

What is claimed is:

1. An automatic frequency tuning system, comprising
    a fixed frequency oscillator,
    a first frequency divider having a fixed division factor and connected to be fed by the fixed frequency oscillator so as to produce a reference frequency,
    a variable frequency oscillator,
    a second divider having a variable division factor and connected to be fed by the variable frequency oscillator so as to produce a variable control frequency,
    phase comparison means connected to receive and compare the phases of the reference and control frequencies whereby to produce a control output having a magnitude and sense dependent on the magnitude and sense of a phase error between the two frequencies compared, integrating means connected to integrate the control output, adjusting means responsive to the integrated control output and connected to adjust the frequency of the variable frequency oscillator in a sense and by an amount such as to tend to equalize the phases and frequencies of the control and reference frequencies, whereby to bring the output frequency of the variable frequency oscillator to a desired value, re-timing means responsive to detection of the said phase error by the phase comparison means and connected to re-time the one of the two dividers producing the instantaneously earlier one of the two frequencies whose phases are compared by the phase comparison means, so that the re-timed one of the two dividers commences its next following division cycle substantially in synchronism with the other of the dividers, a damping circuit, and switching means for switching the damping circuit into circuit with the integrating means when the phase error between the control and reference frequencies is less than a predetermined value corresponding to the minimum amount by which the division cycles of the dividers can be altered.

2. A system according to claim 1, in which the integrating means comprises a first capacitor and the damping circuit comprises a second capacitor, and including means connected to modify the level of the control output in synchronism with the operation of the switching means so that each capacitor is charged to the appropriate voltage.

3. A system according to claim 1 or 2, in which:
each frequency divider comprises a frequency counter having a control input which is connected to have its energization changed when the counter has received the number of count inputs from its input frequency equal in number to the value of an initial count which is set into the counter and which corresponds in number to the division factor of the counter, and means responsive to the change of energization of the control input for re-loading the said initial count into the counter so as to allow counting to re-commence when the energization of the control input reverts to its previous value, and the re-timing means comprises means responsive to the said phase error for temporarily preventing reversion of the energization of the control input of one or other of the counters to its previous value.

4. A system according to claim 2, in which the phase comparison means includes current generating means producing the said control output as a current and in which the means connected to modify the level of the control output in synchronism with the operation of the switching means comprises additional current generating means producing a current output and second switching means connecting the additional current generating means to the second capacitor when the damping circuit is not switched in circuit with the integrating means by the first-mentioned switching means so as to charge the second capacitor with the current output produced by the additional current generating means, the current output produced by the additional current generating means corresponding in sign to the sign of the control output and having a magnitude so related to the magnitude of the control output in dependence on the relative magnitudes of the capacitances of the first and second capacitors as to charge the second capacitor to substantially the same voltage as the first capacitor, and means operating the second switching means to disconnect the additional current generating means when the first-mentioned switching means switches the damping circuit into circuit with the integrating means.

5. A system according to claim 2, in which the phase comparison means includes current generating means producing the said control output as a current, in which the first and second capacitors are connected in series and the switching means is connected in parallel with the second capacitor, and in which the means connected to modify the level of the control output in synchronism with the operation of the switching means comprises second switching means operating in synchronism with the first-mentioned switching means for switching between two values the relationship of the magnitude of the control output to the magnitude of the phase error.

* * * * *